(12) United States Patent
Chen et al.

(10) Patent No.: US 10,459,492 B2
(45) Date of Patent: Oct. 29, 2019

(54) ELECTRONIC DEVICE

(71) Applicant: Wistron Corporation, New Taipei (TW)

(72) Inventors: Jing-Lung Chen, New Taipei (TW); Chia-Lung Hsu, New Taipei (TW); Yao-Jheng Chen, New Taipei (TW); Po-Cheng Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/857,648

(22) Filed: Dec. 29, 2017

(65) Prior Publication Data

US 2019/0163239 A1 May 30, 2019

(30) Foreign Application Priority Data

Nov. 24, 2017 (TW) .............................. 106140852 A

(51) Int. Cl.
| | |
|---|---|
| *G06F 1/16* | (2006.01) |
| *E05D 11/00* | (2006.01) |
| *G06F 1/20* | (2006.01) |
| *H05K 7/20* | (2006.01) |
| *E05D 1/00* | (2006.01) |

(52) U.S. Cl.
CPC ............ *G06F 1/1681* (2013.01); *E05D 11/00* (2013.01); *G06F 1/1618* (2013.01); *G06F 1/1666* (2013.01); *G06F 1/203* (2013.01); *H05K 7/2039* (2013.01); *E05D 1/00* (2013.01); *E05Y 2800/00* (2013.01); *E05Y 2900/606* (2013.01)

(58) Field of Classification Search
CPC .............................. G06F 1/1616; G06F 1/1666
See application file for complete search history.

(56) References Cited

U.S. PATENT DOCUMENTS

| | | | | |
|---|---|---|---|---|
| 5,287,245 A | * | 2/1994 | Lucente | G06F 1/1616 292/163 |
| 5,532,904 A | * | 7/1996 | Sellers | G06F 1/1616 200/344 |
| 5,635,928 A | * | 6/1997 | Takagi | G06F 1/1616 341/22 |

(Continued)

FOREIGN PATENT DOCUMENTS

| | | |
|---|---|---|
| CN | 204633831 | 9/2015 |
| TW | M354838 | 4/2009 |

(Continued)

OTHER PUBLICATIONS

"Office Action of Taiwan Counterpart Application," dated Mar. 13, 2019, p. 1-p. 10.

*Primary Examiner* — Adrian S Wilson
(74) *Attorney, Agent, or Firm* — JCIPRNET

(57) ABSTRACT

An electronic device includes a first machine body, a second machine body, a hinge structure, a moving component, and a towing structure. The hinge structure is configured to pivot the first machine body and the second machine body. The moving component is movably disposed in the first machine body. The towing structure is disposed in the first machine body and is coupled to the hinge structure and the moving component. The towing structure is configured to be driven by the hinge structure to drive the moving component to move relative to the first machine body.

9 Claims, 7 Drawing Sheets

(56) References Cited

U.S. PATENT DOCUMENTS

| | | | | |
|---|---|---|---|---|
| 6,091,600 A | * | 7/2000 | Jeong | G06F 1/1667 |
| | | | | 361/679.12 |
| 6,314,274 B1 | * | 11/2001 | Kumagai | H04M 1/0214 |
| | | | | 361/679.13 |
| 6,529,370 B1 | * | 3/2003 | Kamishima | G06F 1/1616 |
| | | | | 200/5 A |
| 7,187,537 B2 | * | 3/2007 | Liao | G06F 1/1616 |
| | | | | 361/679.09 |
| 7,221,561 B2 | * | 5/2007 | Pan | H01R 35/04 |
| | | | | 361/679.08 |
| 8,111,120 B2 | | 2/2012 | Chang et al. | |
| 8,289,688 B2 | * | 10/2012 | Behar | G06F 1/162 |
| | | | | 361/679.3 |
| 2003/0193419 A1 | * | 10/2003 | Hsu | G06F 1/1616 |
| | | | | 341/22 |
| 2006/0120029 A1 | * | 6/2006 | Ryu | G06F 1/1624 |
| | | | | 361/679.09 |
| 2009/0244832 A1 | * | 10/2009 | Behar | G06F 1/162 |
| | | | | 361/679.55 |
| 2010/0231337 A1 | | 9/2010 | Chang et al. | |
| 2010/0321872 A1 | * | 12/2010 | Sip | G06F 1/1662 |
| | | | | 361/679.2 |
| 2011/0170250 A1 | * | 7/2011 | Bhutani | G06F 1/1666 |
| | | | | 361/679.2 |

FOREIGN PATENT DOCUMENTS

| | | |
|---|---|---|
| TW | 201036511 | 10/2010 |
| TW | M459675 | 8/2013 |
| TW | M461973 | 9/2013 |
| TW | 201433248 | 8/2014 |

\* cited by examiner

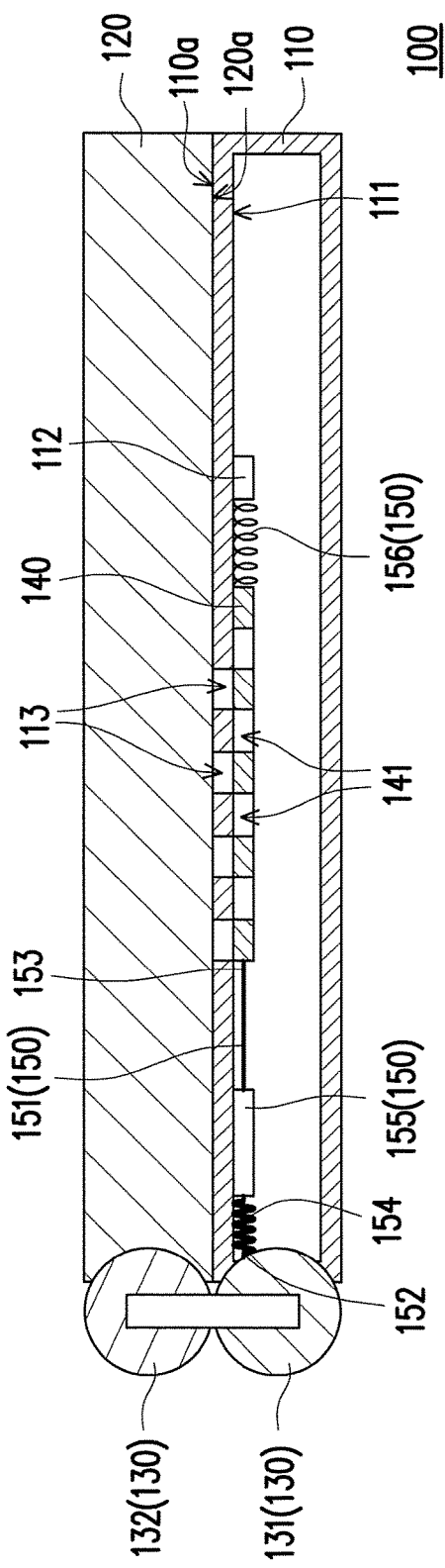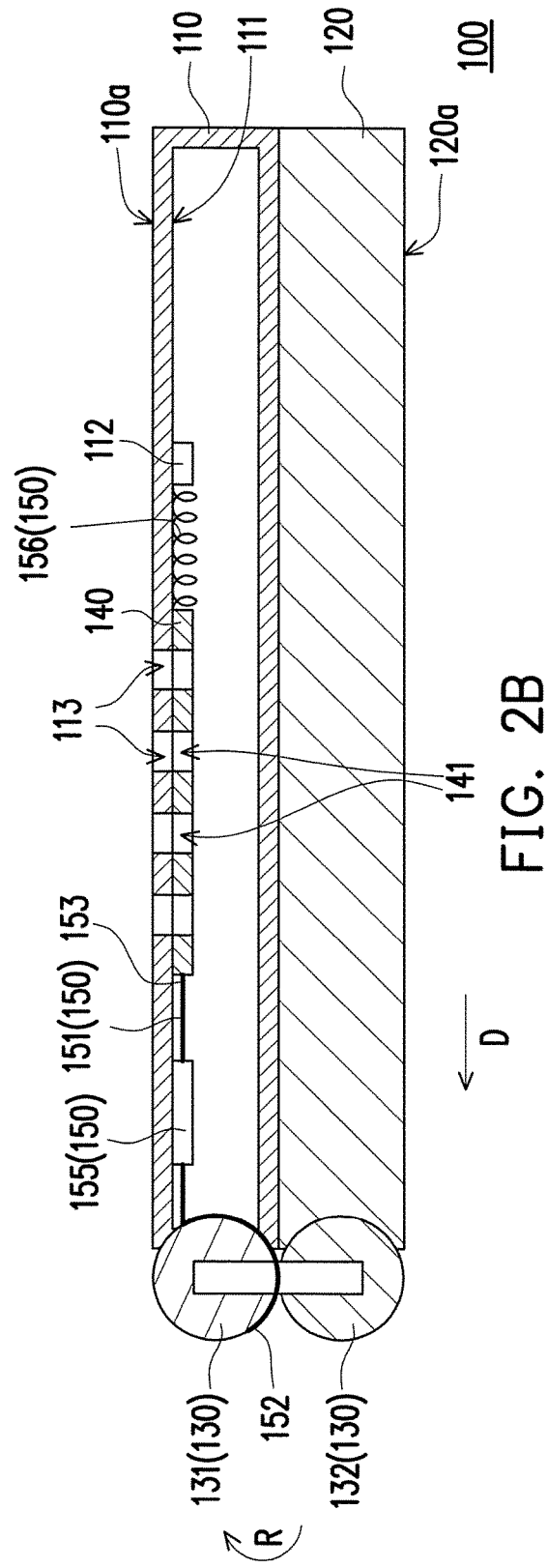
FIG. 2A
FIG. 2B

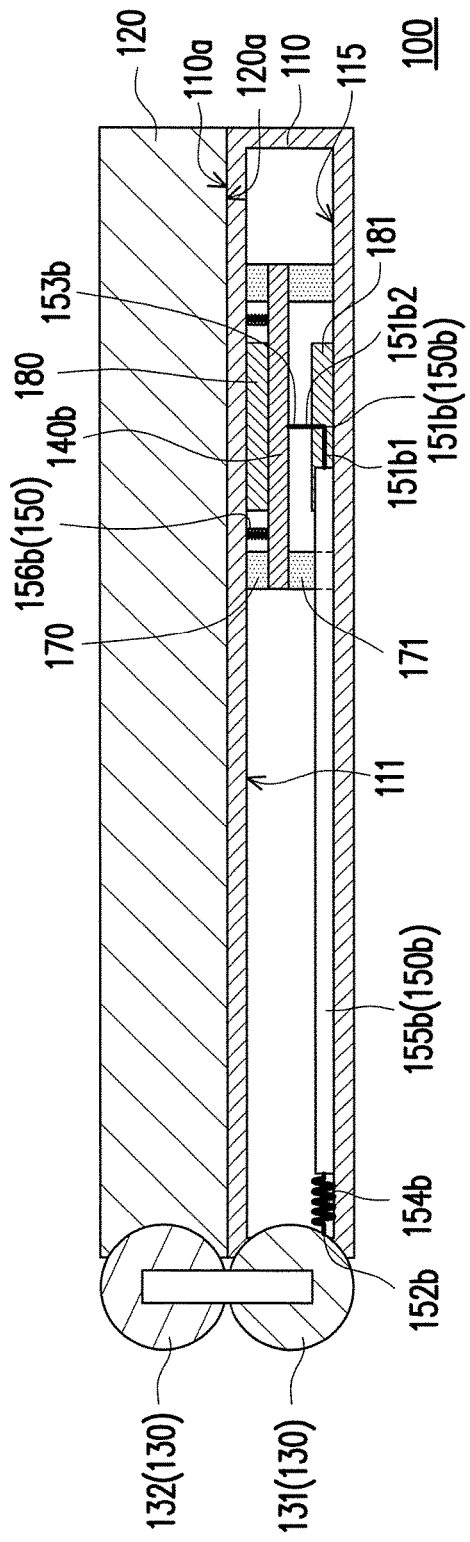
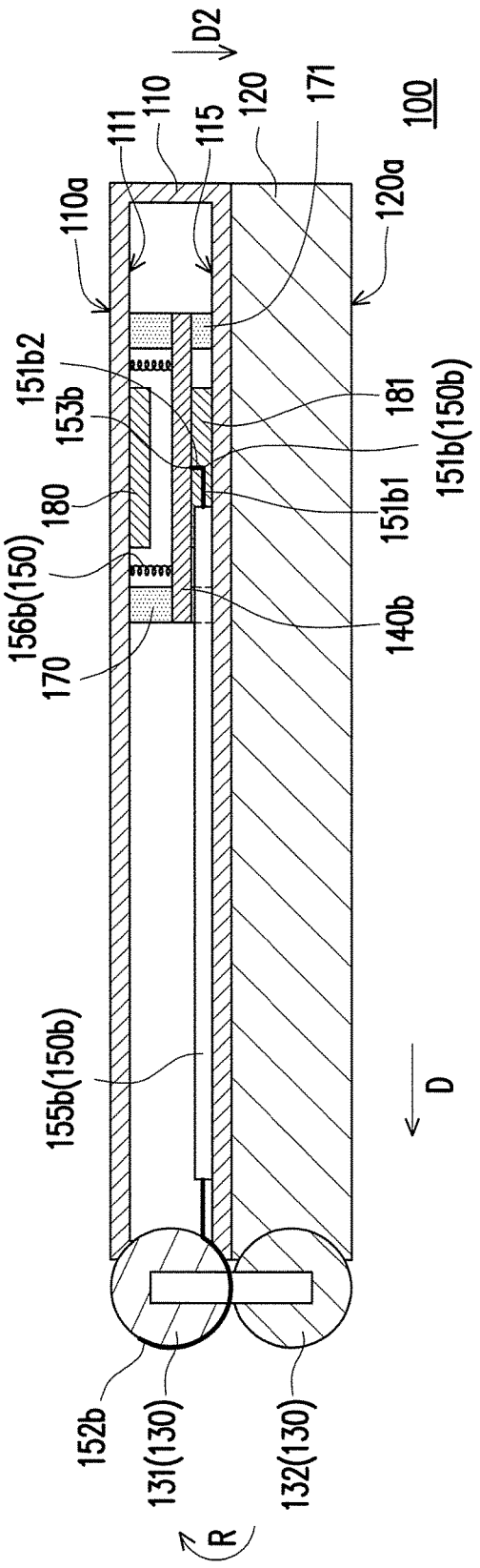
FIG. 4A
FIG. 4B

ELECTRONIC DEVICE

CROSS-REFERENCE TO RELATED APPLICATION

This application claims the priority benefit of Taiwan application serial no. 106140852, filed on Nov. 24, 2017. The entirety of the above-mentioned patent application is hereby incorporated by reference herein and made a part of this specification.

BACKGROUND OF THE INVENTION

1. Field of the Invention

The invention relates to an electronic device. More particularly, the invention relates to an electronic device providing multiple purposes.

2. Description of Related Art

Notebook computers, tablet computers, Smartphones, or other electronic devices bring portability and deliver capabilities of instant processing or receiving and sending information, and thus have become indispensable tools in daily life. Taking notebook computers for example, the processing performance of the notebook computers is better than that of the tablet computers or Smartphones. When a notebook computer operates, electronic elements inside the host generate heat, heat dissipation holes are thus disposed on the case most of the time, so as to dissipate heat to the outside. Nevertheless, external dusts or foreign substances may enter into the host through these heat dissipation holes.

On the other hand, a 360-degree rotatable notebook computer may be switched between a notebook computer mode and a tablet mode. When the 360-degree rotatable notebook computer is switched to the tablet mode, the host is rotated by 360 degrees relative to the display, wherein the back cover of the host and the back cover of the display face each other, and the operating surface of the host (i.e., the surface with the keyboard) and the display surface of the display are opposite to each other and are respectively exposed to the outside. If the host is placed on the table surface, the operating surface of the host (i.e., the surface with the keyboard) is in contact with the table surface, and consequently, the keyboard may be inadvertently touched, or abrasion on the keyboard may be generated after a period of time.

SUMMARY OF THE INVENTION

The invention provides an electronic device providing multiple purposes.

In an embodiment of the invention, an electronic device includes a first machine body, a second machine body, a hinge structure, a moving component, and a towing structure. The hinge structure is configured to pivot the first machine body and the second machine body. The moving component is movably disposed in the first machine body. The towing structure is disposed in the first machine body and is coupled to the hinge structure and the moving component. The towing structure is configured to be driven by the hinge structure to drive the moving component to move relative to the first machine body.

In an embodiment of the invention, the hinge structure includes a first hinge and a second hinge rotatably connected to each other. The first hinge is connected to the first machine body, and the second hinge is connected to the second machine body.

In an embodiment of the invention, the towing structure includes a towing rope, and the towing rope has a first end portion and a second end portion opposite to each other. The first end portion is connected to the first hinge, and the second end portion is connected to the moving component. The towing rope is configured to move along with rotation of the first hinge and drive the moving component to move relative to the first machine body.

In an embodiment of the invention, the towing structure further includes a sleeve fixed into the first machine body. The towing rope penetrates through the sleeve.

In an embodiment of the invention, the towing structure further includes an elastic component fixed into the first machine body and connected to the moving component. The towing rope and the elastic component are respectively located at two opposite sides of the moving component.

In an embodiment of the invention, one side of the first machine body has a plurality of first opening holes, and the moving component is disposed corresponding to the first opening holes. The moving component is driven by the towing structure to move relative to the first machine body to expose or cover the first opening holes.

In an embodiment of the invention, the moving component has a plurality of second opening holes configured to be respectively aligned to the first opening holes or misaligned to the first opening holes when the moving component is driven by the towing structure to move relative to the first machine body.

In an embodiment of the invention, one side of the first machine body has a plurality of opening holes, and the moving component is disposed corresponding to the opening holes. The electronic device further includes a plurality of pads which may be movably disposed in the opening holes. The pads are configured to be guided by the moving component to partially move out of the opening holes respectively when the moving component is driven by the towing structure to move relative to the first machine body.

In an embodiment of the invention, a first guiding portion of each of the pads is located in the first machine body, and the moving component has a plurality of second guiding portions disposed corresponding to the first guiding portions. Each of the second guiding portions is configured to push the corresponding first guiding portion when the moving component is driven by the towing structure to move relative to the first machine body such that each of the pads is partially pushed out of the corresponding opening hole.

In an embodiment of the invention, the moving component is an electronic element, and the electronic device further includes a first buffer component and a second buffer component. The first buffer component and the second buffer component are disposed in the first machine body and are respectively located at two opposite sides of the electronic element. The first machine body has a first inner surface and a second inner surface opposite to each other. the first buffer component is abutted against the electronic element and the first inner surface, and the second buffer component is abutted against the electronic element and the second inner surface.

In an embodiment of the invention, the electronic device further includes a first heat dissipation component disposed at the first inner surface and a second heat dissipation component disposed at the second inner surface. When the electronic element is driven by the towing structure to move towards the first inner surface, the electronic element compresses the first buffer component and is in contact with the first heat dissipation component. When the electronic element is driven by the towing structure to move towards the second inner surface, the electronic element compresses the second buffer component and is in contact with the second heat dissipation component.

To sum up, in the electronic device provided by the embodiments of the invention, when the hinge structure is rotated, the towing structure may be driven, and that the moving component is driven by the towing structure to move relative to the first machine body. After the moving component moves relative to the first machine body, heat is dissipated, dusts are prevented from entering, and supporting function is also provided.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A and FIG. 2B are respectively cross-sectional views of the electronic device of FIG. 1A and FIG. 1B taken along a line I-I and respectively illustrate the states of the electronic device before and after being actuated.

FIG. 4A and FIG. 4B are respectively cross-sectional views of the electronic device of FIG. 1A and FIG. 1B taken along a line K-K and respectively illustrate states of the electronic device before and after being actuated.

DESCRIPTION OF THE EMBODIMENTS

Figure 1A:
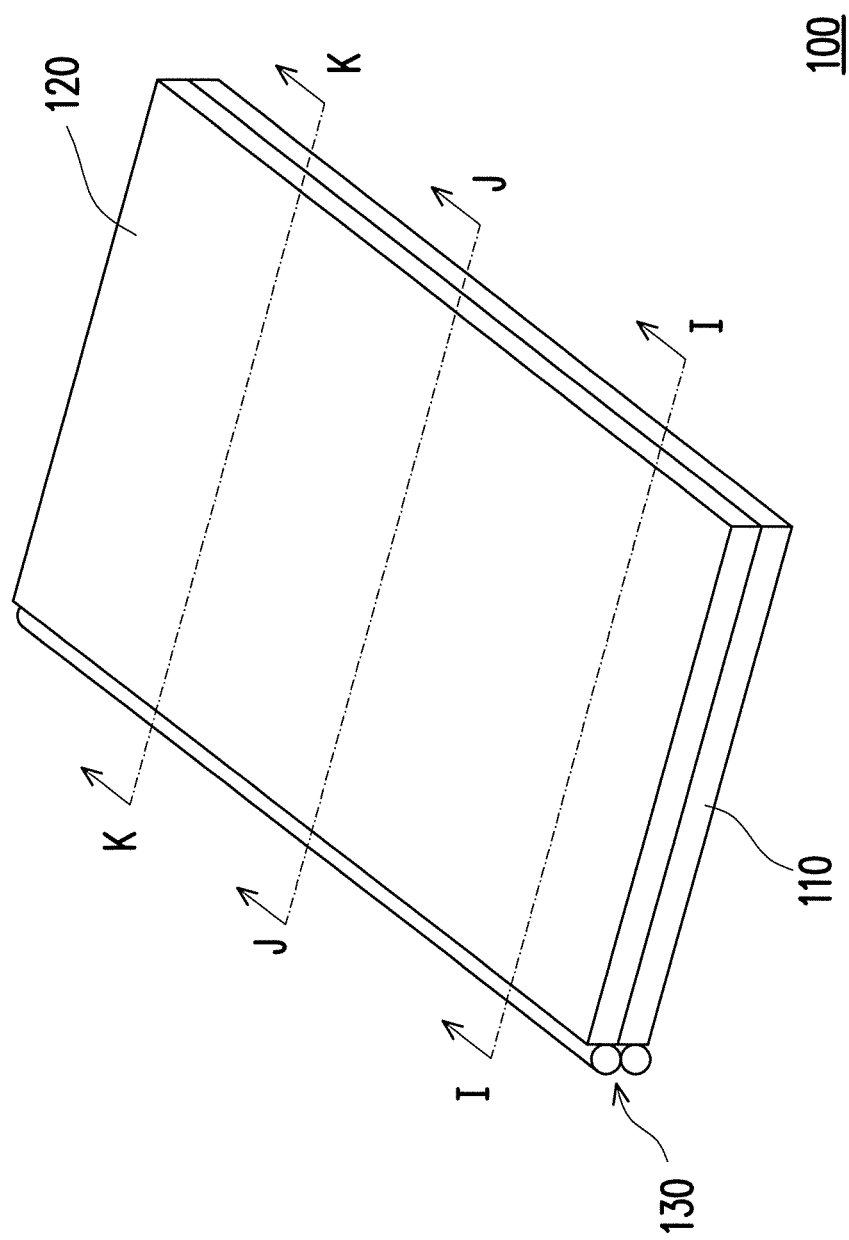
FIG. 1A and FIG. 1B are respectively schematic views of an electronic device in two different states according to an embodiment of the invention.

Reference will now be made in detail to the present preferred embodiments of the disclosure, examples of which are illustrated in the accompanying drawings. Wherever possible, the same reference numbers are used in the drawings and the description to refer to the same or like parts.

Figure 1B:
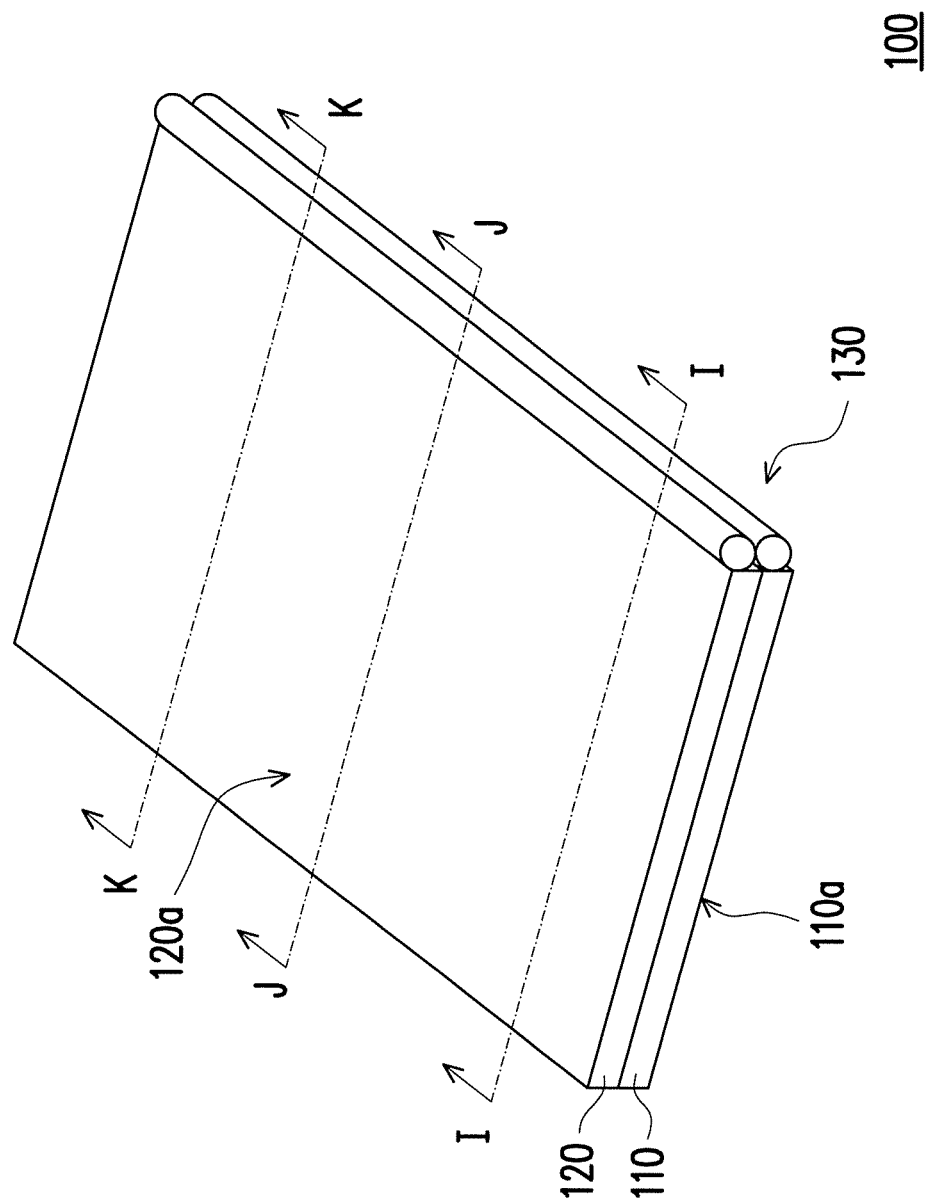

FIG. 1A and FIG. 1B are respectively schematic views of an electronic device in two different states according to an embodiment of the invention. FIG. 2A and FIG. 2B are respectively cross-sectional views of the electronic device of FIG. 1A and FIG. 1B taken along a line I-I and respectively illustrate the states of the electronic device before and after being actuated. With reference to FIG. 1A, FIG. 1B, FIG. 2A, and FIG. 2B, in the present embodiment, an electronic device 100 is, for example, a notebook computer or a combination of a tablet computer and a docking station, which is not limited by the invention herein. The electronic device 100 herein is, for example, a 360-degree rotatable notebook computer. The electronic device 100 illustrated in FIG. 1A and FIG. 2A is in a folded state. An operating surface 110a (e.g., the surface with a keyboard) of a first machine body 110 and a display surface 120a of a second machine body 120 face each other and are attached to each other. Alternatively, gaps may also be maintained between the operating surface 110a and the display surface 120a. Next, the first machine body 110 is rotated by 360 degrees relative to the second machine body 120. The electronic device 100 is switched to a fully unfolded state as shown in FIG. 1B and FIG. 2B; in other words, the electronic device 100 is in a tablet mode. At this time, the operating surface 110a (i.e., the surface with the keyboard) of the first machine body 110 and the display surface 120a of the second machine body 120 are opposite to each other and are respectively exposed to an outside. FIG. 1B illustrates the electronic device 100 in the fully unfolded state, the display surface 120a of the second machine body 120 faces upwards, and the operating surface 110a (i.e., the surface with the keyboard) of the first machine body 110 faces downwards.

The electronic device 100 includes the first machine body 110, the second machine body 120, a hinge structure 130, a first moving component 140, and a first towing structure 150, wherein the first machine body 110 may be a host, and the second machine body 120 may be a display. The hinge structure 130 is configured to pivot the first machine body 110 and the second machine body 120, such that the first machine body 110 may be rotated by 360 degrees relative to the second machine body 120 through the hinge structure 130. On the other hand, the first moving component 140 may be movably disposed in the first machine body 110, wherein the first towing structure 150 is disposed in the first machine body 110 and is coupled to the hinge structure 130 and the first moving component 140. The first moving component 140 and the first towing structure 150 are substantially disposed at a first inner surface 111 of the first machine body 110. When the hinge structure 130 is actuated, the first towing structure 150 is driven by the hinge structure 130 to actuate and drive the first moving component 140 to move relative to the first machine body 110 or drive the first moving component 140 to slide on the first inner surface 111.

Further, the hinge structure 130 includes a first hinge 131 and a second hinge 132 rotatably connected to each other. The first hinge 131 is connected to the first machine body 110, and the second hinge 132 is connected to the second machine body 120. In the present embodiment, the first towing structure 150 is coupled to the first hinge 131, wherein the first towing structure 150 includes a towing rope 151, and the towing rope 151 has a first end portion 152 and a second end portion 153 opposite to each other. The first end portion 152 is connected to the first hinge 131, and the second end portion 153 is connected to the first moving component 140. When the first hinge 131 rotates, the towing rope 151 is driven by the first hinge 131 to move and drive the first moving component 140 to move relative to the first machine body 110.

During the electronic device 100 is switched from the folded state illustrated in FIG. 2A to the fully unfolded state illustrated in FIG. 2B (i.e., the table mode), the first hinge 131 rotates along a rotating direction R (e.g., in the clockwise direction) and drives the towing rope 151 to move towards the first hinge 131 in a moving direction D. The first moving component 140 driven by the towing rope 151 also moves towards the first hinge 131 along the moving direction D. After the electronic device 100 is switched to the fully unfolded state shown in FIG. 2B (i.e., the tablet mode), the first hinge 131, for example, rotates by 180 degrees along the rotating direction R (e.g., in the clockwise direction), and a portion of the towing rope 151 winds on the first hinge 131. Note that the towing rope 151 also has a reserved segment 154 located between the first end portion 152 and the second end portion 153, and a length of the reserved segment 154 involves rotation of the first hinge 131 and movement of the first moving component 140.

On the other hand, the first towing structure 150 further includes a sleeve 155 fixed to the first inner surface 111 of the first machine body 110. The towing rope 151 penetrates through the sleeve 155. In practical applications, the sleeve 155 may prevent the towing rope 151 from falling down; alternatively, the sleeve 155 may guide the towing rope 151 so as to prevent the towing rope 151 from being displaced when moving. The first towing structure 150 further includes an elastic component 156, and the towing rope 151 and the elastic component 156 are respectively located at two opposite sides of the first moving component 140. For instance, a boss 112 is disposed at the first inner surface 111 of the first machine body 110, one end of the elastic component 156 is fixed to the boss 112, and the other end of the elastic component 156 is connected to the first moving component 140. In an embodiment that is not illustrated, a pulley may be disposed in the first machine body, and the towing rope may be used to be coupled to or sleeved on the pulley, as such, the towing rope may move more smoothly, and the towing rope is prevented from being displaced when moving.

In the present embodiment, the elastic component 156 may be an extension spring, but the invention is not limited to the above. In other embodiments, a compression spring or a torsion spring may also be adopted. The elastic component 156 illustrated in FIG. 2A, for example, is in an initial state (i.e., deformation not yet generated). When the electronic device 100 is switched from the folded state illustrated in FIG. 2A to the fully unfolded state illustrated in FIG. 2B (i.e., the tablet mode), the first moving component 140 moves towards the first hinge 131 along the moving direction D, as such, the elastic component 156 is extended and elastic deformation is thus generated. If the electronic device 100 is restored from the fully unfolded state illustrated in FIG. 2B (i.e., the tablet mode) to the folded state illustrated in FIG. 2A, an elastic restoring force of the elastic component 156 may drive the first moving component 140 to move along a direction opposite to the moving direction D, such that the first moving component 140 returns to an initial position illustrated in FIG. 2A.

One side of the first machine body 110 (i.e., the side where the first inner surface 111 is located) has a plurality of first opening holes 113 configured to communicate an inner portion of the first machine body 110 with the outside environment. The first moving component 140 is disposed corresponding to the first opening holes 113. In the state shown in FIG. 2A, the first moving component 140 covers the first opening holes 113, such that external dusts or foreign substances are prevented from entering into the inner portion of the first machine body 110 through the first opening holes 113. After the first moving component 140 is driven by the towing rope 151 to move towards the first hinge 131 along the moving direction D, the first opening holes 113 are not covered by the first moving component 140 and thus are exposed to the first moving component 140, as shown in FIG. 2B. When the first opening holes 113 are not covered by the first moving component 140 and thus communicate the inner portion of the first machine body 110 with the outside environment, heat generated when electronic elements in the first machine body 110 operate may be exhausted to the outside through the first opening holes 113. Alternatively, sound made by a speaker may also be transmitted to the outside through the first opening holes 113. On the other hand, if the electronic device 100 is restored from the fully unfolded state illustrated in FIG. 2B (i.e., the tablet mode) to the folded state illustrated in FIG. 2A, the elastic restoring force of the elastic component 156 may drive the first moving component 140 to move along the direction opposite to the moving direction D, such that the first moving component 140 returns to the initial position illustrated in FIG. 2A and covers the first opening holes 113 again.

Further, the first moving component 140 has a plurality of second opening holes 141, and a number of the second opening holes 141, for example, is equal to a number of the first opening holes 113. In the state shown in FIG. 2A, the second opening holes 141 are respectively misaligned to the first opening holes 113, meaning that the first opening holes 113 are covered by a physical portion of the first moving component 140. After the first moving component 140 is driven by the towing rope 151 to move towards the first hinge 131 along the moving direction D, the second opening holes 141 are respectively aligned to the first opening holes 113, such that the inner portion of the first machine body 110 and the outside environment are communicated with each other through the first opening holes 113 and the second opening holes 141. On the other hand, if the electronic device 100 is restored from the fully unfolded state illustrated in FIG. 2B (i.e., the tablet mode) to the folded state illustrated in FIG. 2A, the elastic restoring force of the elastic component 156 may drive the first moving component 140 to move along the direction opposite to the moving direction D, such that the first moving component 140 returns to the initial position illustrated in FIG. 2A and that the second opening holes 141 are respectively misaligned to the first opening holes 113 again. That is, the physical portion of the first moving component 140 covers the first opening holes 113.

Figure 3A:
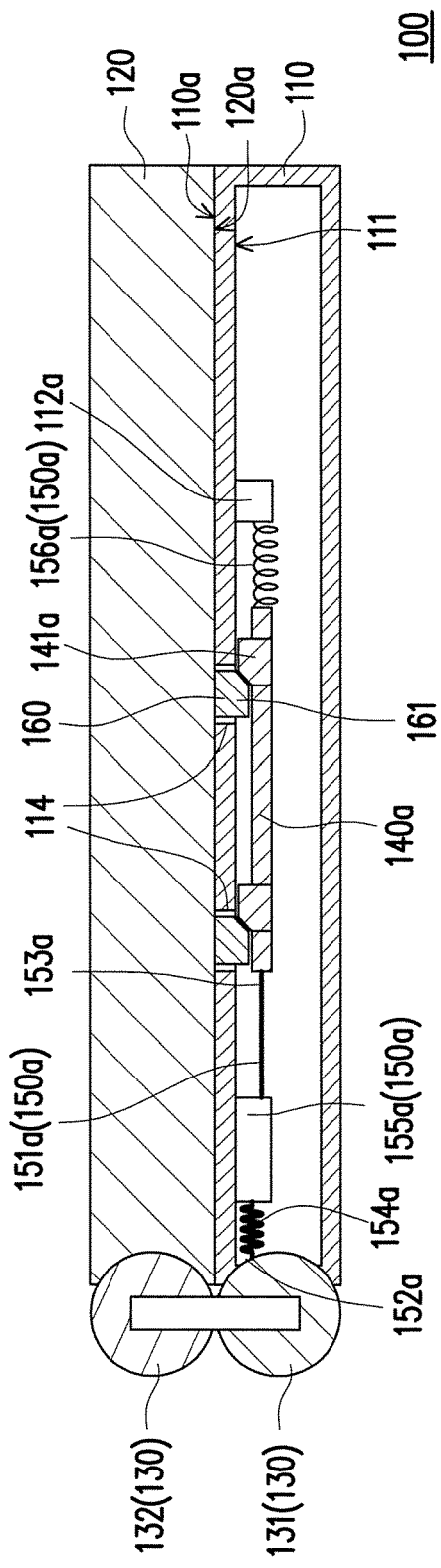
FIG. 3A and FIG. 3B are respectively cross-sectional views of the electronic device of FIG. 1A and FIG. 1B taken along a line J-J and respectively illustrate states of the electronic device before and after being actuated.
Figure 3B:
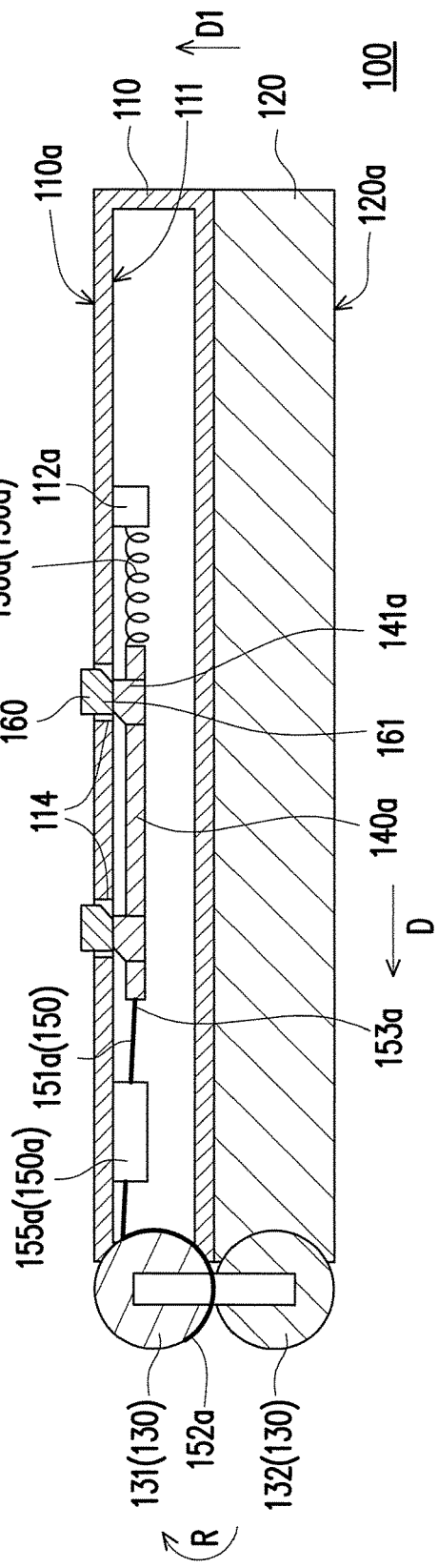

FIG. 3A and FIG. 3B are respectively cross-sectional views of the electronic device of FIG. 1A and FIG. 1B taken along a line J-J and respectively illustrate states of the electronic device before and after being actuated. With reference to FIG. 3A and FIG. 3B, the electronic device 100 further includes a second moving component 140a and a second towing structure 150a in this embodiment. The second moving component 140a may be movably disposed in the first machine body 110, and the second towing structure 150a is disposed in the first machine body 110. The second towing structure 150a is configured to pivot the hinge structure 130 and the second moving component 140a. The second moving component 140a and the second towing structure 150a are substantially disposed at the first inner surface 111 of the first machine body 110. When the hinge structure 130 is actuated, the second towing structure 150a is driven by the hinge structure 130 to actuate and drive the second moving component 140a to move relative to the first machine body 110 or drive the second moving component 140a to slide on the first inner surface 111.

The second towing structure 150a is coupled to the first hinge 131, wherein the second towing structure 150a includes a towing rope 151a, and the towing rope 151a has a first end portion 152a and a second end portion 153a opposite to each other. The first end portion 152a is connected to the first hinge 131, and the second end portion 153a is connected to the second moving component 140a. When the first hinge 131 rotates, the towing rope 151a is driven by the first hinge 131 to move and drive the second moving component 140a to move relative to the first machine body 110.

When the electronic device 100 is switched from the folded state illustrated in FIG. 3A to the fully unfolded state illustrated in FIG. 3B (i.e., the tablet mode), the first hinge 131 rotates along the rotating direction R (e.g., in the clockwise direction) and drives the towing rope 151a to move towards the first hinge 131 along the moving direction D. The second moving component 140a driven by the towing rope 151a also moves towards the first hinge 131 along the moving direction D. After the electronic device 100 is switched to the fully unfolded state shown in FIG. 3B (i.e., the tablet mode), the first hinge 131, for example, rotates by 180 degrees along the rotating direction R (e.g., in the clockwise direction), and a portion of the towing rope 151a winds on the first hinge 131. Note that the towing rope 151a also has a reserved segment 154a located between the first end portion 152a and the second end portion 153a, and a length of the reserved segment 154a involves rotation of the first hinge 131 and movement of the second moving component 140a.

On the other hand, the second towing structure 150a further includes a sleeve 155a fixed to the first inner surface 111 of the first machine body 110. The towing rope 151a penetrates through the sleeve 155a. In practical applications, the sleeve 155a may prevent the towing rope 151a from falling down; alternatively, the sleeve 155a may guide the towing rope 151a to prevent the towing rope 151a from being displaced when moving. The second towing structure 150a further includes an elastic component 156a, and the towing rope 151a and the elastic component 156a are respectively located at two opposite sides of the second moving component 140a. For instance, a boss 112a is disposed at the first inner surface 111 of the first machine body 110, one end of the elastic component 156a is fixed to the boss 112a, and the other end of the elastic component 156a is connected to the second moving component 140a. In an embodiment that is not illustrated, a pulley may be disposed in the first machine body, and the towing rope may be used to be coupled to or sleeved on the pulley, as such, the towing rope may move more smoothly, and the towing rope is prevented from being displaced when moving.

In the present embodiment, the elastic component 156a may be an extension spring, but the invention is not limited to the above. In other embodiments, a compression spring or a torsion spring may also be adopted. The elastic component 156a illustrated in FIG. 3A, for example, is in an initial state (i.e., deformation not yet generated). When the electronic device 100 is switched from the folded state illustrated in FIG. 3A to the fully unfolded state illustrated in FIG. 3B (i.e., the tablet mode), the second moving component 140a moves towards the first hinge 131 along the moving direction D, as such, the elastic component 156a is extended and elastic deformation is thus generated. If the electronic device 100 is restored from the fully unfolded state illustrated in FIG. 3B (i.e., the tablet mode) to the folded state illustrated in FIG. 3A, an elastic restoring force of the elastic component 156a may drive the second moving component 140a to move along the direction opposite to the moving direction D, such that the second moving component 140a is returned to an initial position illustrated in FIG. 3A.

One side of the first machine body 110 (i.e., the side where the first inner surface 111 is located) has a plurality of opening holes 114, and the second moving component 140a are disposed corresponding to the opening holes 114. On the other hand, the electronic device 100 further includes a plurality of pads 160 movably disposed in the opening holes 114. For instance, the pads 160 may be respectively engaged with, sleeved on, or sliding connected to the opening holes 114. As such, the pads 160 may respectively move inside the opening holes 114 without falling out of the opening holes 114. In the state shown in FIG. 3A, a first guiding portion 161 of each of the pads 160 is located in the first machine body 110, that is to say, the first guiding portion 161 of each of the pads 160 protrudes from the first inner surface 111. The second moving component 140a has a plurality of second guiding portions 141a correspondingly disposed to the first guiding portions 161, and each of the second guiding portions 141a is abutted against one first guiding portion 161.

After the second moving component 140a is driven by the towing rope 151a to move towards the first hinge 131 along the moving direction D, each of the first guiding portions 161 is pushed by the corresponding second guiding portion 141a. As such, each of the pads 160 can move inside the corresponding opening hole 114 in a moving direction D1 perpendicular to the moving direction D, a portion of each of the pads 160 can move out of the corresponding opening hole 114, and the first guiding portion 161 of each of the pads 160 can move into the opening hole 114, as shown in FIG. 3B.

In the state shown in FIG. 3B, a portion of each of the pads 160 protrudes from the operating surface 110a (i.e., the surface with the keyboard) of the first machine body 110. If the operating surface 110a (i.e., the surface with the keyboard) of the first machine body 110 is abutted against a table surface, the pads 160 may provide a supporting function, and that the operating surface 110a (i.e., the surface with the keyboard) is prevented from being in contact with the table surface directly to be abraded. Otherwise, when the electronic device 100 is dropped, the pads 160 may serve to mitigate the impact force. On the other hand, if the electronic device 100 is restored from the frilly unfolded state illustrated in FIG. 3B (i.e., the tablet mode) to the folded state illustrated in FIG. 3A, the elastic restoring force of the elastic component 156a may drive the second moving component 140a to move along the direction opposite to the moving direction D, such that the second moving component 140a is returned to the initial position illustrated in FIG. 3A. Simultaneously, each of the first guiding portions 161 is no longer pushed by the corresponding second guiding portion 141a. As shown in FIG. 3A, each of the pads 160 thereby moves inside the corresponding opening hole 114 along a direction opposite to the moving direction D1, and moreover, the first guiding portion 161 of each of the pads 160 is driven to move back into the first machine body 110.

FIG. 4A and FIG. 4B are respectively cross-sectional views of the electronic device of FIG. 1A and FIG. 1B taken along a line K-K and respectively illustrate states of the electronic device before and after being actuated. With reference to FIG. 4A and FIG. 4B, the electronic device 100 further includes a third moving component 140b and a third towing structure 150b in this embodiment. The third moving component 140b may be movably disposed in the first machine body 110, and the third towing structure 150b is disposed in the first machine body 110. The third towing structure 150b is configured to pivot the hinge structure 130 and the third moving component 140b. The third moving component 140b is located between the first inner surface 111 of the first machine body 110 and a second inner surface 115 opposite to the first inner surface 111 and is not in contact with the first inner surface 111 nor the second inner surface 115 directly. The third towing structure 150b is substantially disposed at the second inner surface 115 of the first machine body 110. When the hinge structure 130 is actuated, the third towing structure 150b is driven by the hinge structure 130 to actuate and drive the third moving component 140b to move relative to the first machine body 110 or drive the third moving component 140b to move between the first inner surface 111 and the second inner surface 115.

The third towing structure 150b is coupled to the first hinge 131, wherein the third towing structure 150b includes a towing rope 151b, and the towing rope 151b has a first end portion 152b and a second end portion 153b opposite to each other. The first end portion 152b is connected to the first hinge 131, and the second end portion 153b is connected to the third moving component 140b. When the first hinge 131 rotates, the towing rope 151b is driven by the first hinge 131 to move and drive the third moving component 140b to move relative to the first machine body 110. As shown in FIG. 3A, the towing rope 151b is bent and thus the towing rope 151b is divided into a first segment 151b1 parallel to the second inner surface 115 and a second segment 151b2 perpendicular to the second inner surface 115. The first segment 151b1 is connected to the first hinge 131 through the first end portion 152b, and the second segment 151b2 is connected to the third moving component 140b through the second end portion 153b.

When the electronic device 100 is switched from the folded state illustrated in FIG. 4A to the fully unfolded state illustrated in FIG. 4B (i.e., the tablet mode), the first hinge 131 rotates along the rotating direction R (e.g., in the clockwise direction) and drives the first segment 151b1 to move towards the first hinge 131 along the moving direction D, the second segment 151b2 moves towards the second inner surface 115 along a direction D2 perpendicular to the moving direction D, and the third moving component 140b driven by the second segment 151b2 also moves towards the second inner surface 115 along the moving direction D2. After the electronic device 100 is switched to the fully unfolded state shown in FIG. 4B (i.e., the tablet mode), the first hinge 131, for example, rotates by 180 degrees along the rotating direction R (e.g., in the clockwise direction), and a portion of the towing rope 151b winds on the first hinge 131. Note that the towing rope 151b also has a reserved segment 154b located between the first end portion 152b and the second end portion 153b, and a length of the reserved segment 154b involves rotation of the first hinge 131 and movement of the third moving component 140b.

On the other hand, the third towing structure 150b further includes a sleeve 155b fixed to the second inner surface 115 of the first machine body 110. The first segment 151b1 of the towing rope 151b penetrates through the sleeve 155b. In practical applications, the sleeve 155b may prevent the towing rope 151b from falling down; alternatively, the sleeve 155b may guide the towing rope 151b to prevent the towing rope 151b from being displaced when moving. The third towing structure 150b further includes an elastic component 156b, and the towing rope 151b and the elastic component 156b are respectively located at two opposite sides of the third moving component 140b. One end of the elastic component 156 is fixed to the first inner surface 111, and the other end of the elastic component 156b is connected to the third moving component 140b. In an embodiment that is not illustrated, a pulley may be disposed in the first machine body, and the towing rope may be used to be coupled to or sleeved on the pulley, as such, the towing rope may move more smoothly, and the towing rope is prevented from being displaced when moving.

In the present embodiment, the elastic component 156b may be an extension spring, but the invention is not limited to the above. In other embodiments, a compression spring or a torsion spring may also be adopted. The elastic component 156b illustrated in FIG. 4A, for example, is in an initial state (i.e., deformation not yet generated). When the electronic device 100 is switched from the folded state illustrated in FIG. 4A to the fully unfolded state illustrated in FIG. 4B (i.e., the tablet mode), the third moving component 140b moves towards the second inner surface 115 along the moving direction D2, as such, the elastic component 156b is extended and elastic deformation is thus generated. If the electronic device 100 is restored from the fully unfolded state illustrated in FIG. 4B (i.e., the tablet mode) to the folded state illustrated in FIG. 4A, an elastic restoring force of the elastic component 156b may drive the third moving component 140b to move towards the first inner surface 111 along a direction opposite to the moving direction D2, such that the third moving component 140b is returned to an initial position illustrated in FIG. 4A.

The electronic device 100 further includes a first buffer component 170 and a second buffer component 171 in this embodiment. The first buffer component 170 and the second buffer component 171 are disposed in the first machine body 110 and are respectively located at two opposite sides of the third moving component 140b. Further, two opposite end portions of the first buffer component 170 are respective abutted against the third moving component 140b and the first inner surface 111, and two opposite end portions of the second buffer component 171 are respective abutted against the third moving component 140b and the second inner surface 115. In the state shown in FIG. 4A, the first buffer component 170, for example, is in a compressed state, and a thickness of the first buffer component 170 is less than a thickness of the second buffer component 171.

The third moving component 140b may be a hard disk drive (HDD) or other electronic element and is not in contact with the first inner surface 111 nor the second inner surface 115 directly as the third moving component 140b is supported by the first buffer component 170 and the second buffer component 171. Moreover, the first buffer component 170 and the second buffer component 171 may also provide a buffering effect and prevent the third moving component 140b from being damaged when being impacted by external forces. The electronic device 100 further includes a first heat dissipation component 180 disposed at the first inner surface 111 and a second heat dissipation component 181 disposed at the second inner surface 115. The first heat dissipation component 180 and the second heat dissipation component 181 may be heat dissipation sheets and are respectively attached to the first inner surface 111 and the second inner surface 115. In the state illustrated in FIG. 4A, the third moving component 140b is in contact with the first heat dissipation component 180 to dissipate heat generated when the hard disk drive (HDD) operates or when other electronic elements operate.

After the third moving component 140b is driven by the towing rope 151b to move towards the second inner surface 115 along the moving direction D2, the third moving component 140b compresses the second buffer component 171, as such, the third moving component 140b is in contact with the second heat dissipation component 181 and that heat generated when the hard disk drive (HDD) operates or when other electronic elements operate is dissipated, as shown in FIG. 4B. Simultaneously, a thickness of the compressed second buffer component 171 is less than a thickness of the first buffer component 170 being released and restored to an original shape. On the other hand, if the electronic device 100 is restored from the frilly unfolded state illustrated in FIG. 4B (i.e., the tablet mode) to the folded state illustrated in FIG. 4A, the elastic restoring force of the elastic component 156b may drive the third moving component 140b to move towards the first inner surface 111 along the direction opposite to the moving direction D2, such that the third moving component 140b is returned to the initial position illustrated in FIG. 4A. Simultaneously, the second buffer component 171 is released and restored to an original shape, the first buffer component 170 is compressed by the third moving component 140b again, and the third moving component 140b is once again in contact with the first heat dissipation component 180.

Figure 5A:
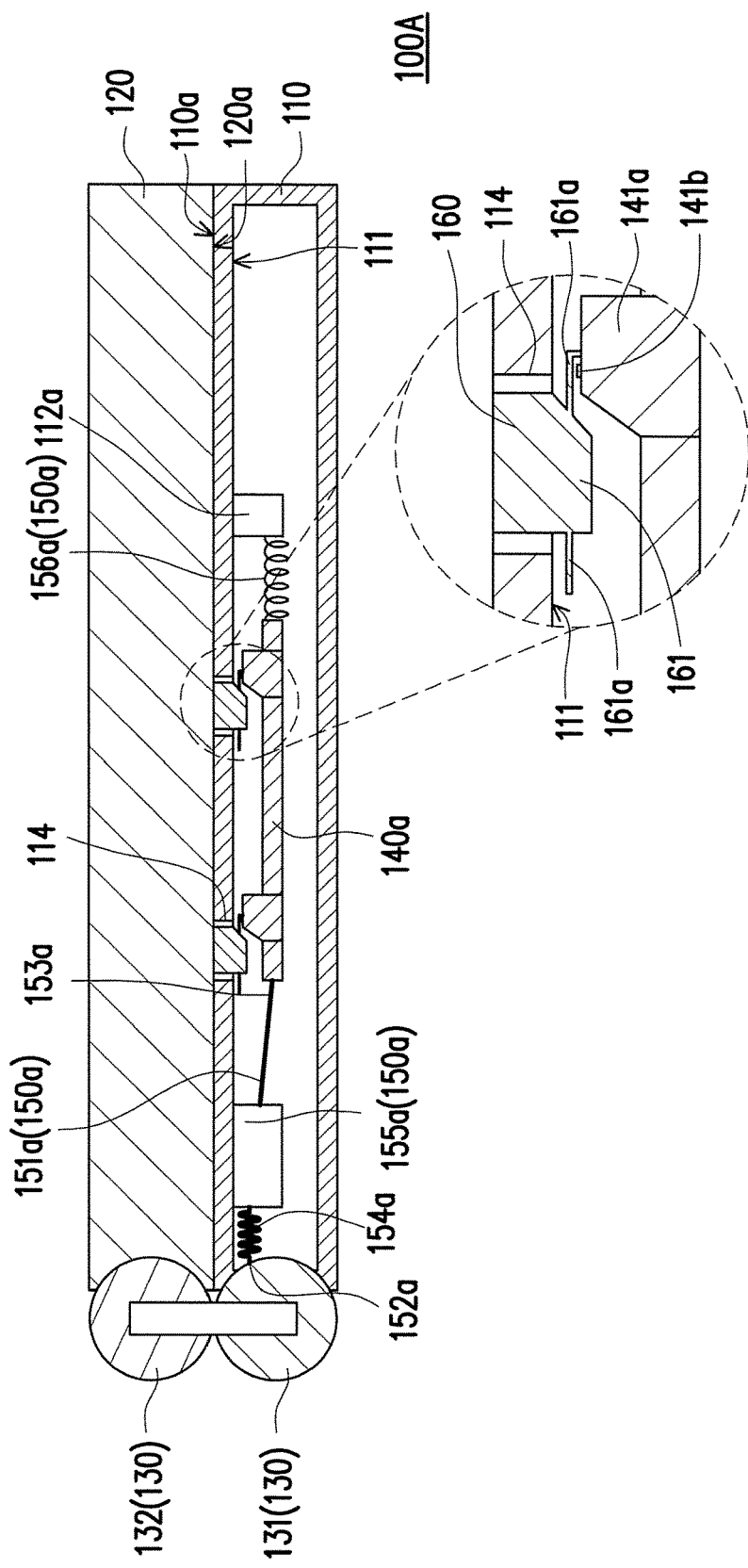
FIG. 5A and FIG. 5B are respectively cross-sectional views of an electronic device according to another embodiment of the invention and respectively illustrate states of the electronic device before and after being actuated.
Figure 5B:
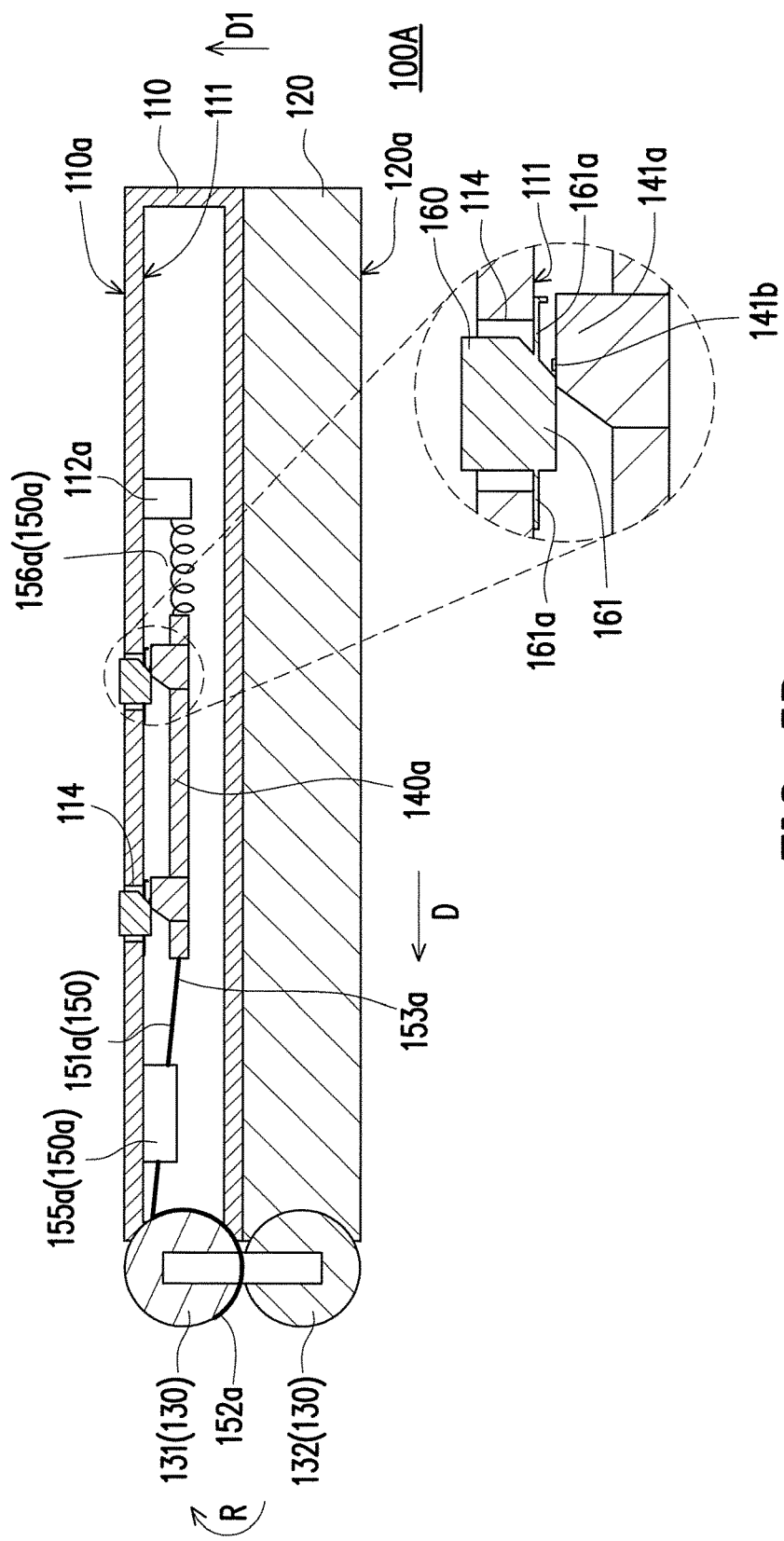

FIG. 5A and FIG. 5B are respectively cross-sectional views of an electronic device according to another embodiment of the invention and respectively illustrate states of the electronic device before and after being actuated. Note that an electronic device 100A shown in FIG. 5A and FIG. 5B is approximately similar to the electronic device 100 shown in FIG. 3A and FIG. 3B, wherein identical or similar elements are assigned with identical reference numerals, and detailed descriptions of how the elements are disposed or actuated are not further provided hereinafter. A difference between the electronic device 100A and the electronic device 100 is illustrated as follows.

In the state shown in FIG. 5A, the first guiding portion 161 of each of the pads 160 is located in the first machine body 110, that is to say, the first guiding portion 161 of each of the pads 160 protrudes from the first inner surface 111. Each of the first guiding portion 161 includes a position-limiting portion 161a, and the position-limiting portions 161a respectively extend from opposite sides of the first guiding portion 161. The position-limiting portions 161a extending from each side of the first guiding portion 161 are, for example, parallel to the first inner surface 111 and extend over the corresponding opening hole 114, so as to prevent each of the pads 160 from falling out of the corresponding opening hole 114. The second moving component 140a has a plurality of second guiding portions 141a corresponding to the first guiding portions 161, and each of the first guiding portions 161 is abutted against the corresponding second guiding portion 141a through, for example, the corresponding position-limiting portion 161a.

After the second moving component 140a is driven by the towing rope 151a to move towards the first hinge 131 along the moving direction D, each of the first guiding portions 161 is pushed by the corresponding second guiding portion 141a. As such, each of the pads 160 can move inside the corresponding opening hole 114 along the moving direction D1 perpendicular to the moving direction D, a portion of each of the pads 160 can move out of the corresponding opening hole 114, and the first guiding portion 161 of each of the pads 160 can move into the opening hole 114, as shown in FIG. 5B. A position-limiting portion 141b may be disposed at a top surface of each of the second guiding portions 141a facing the first inner surface 111 and is, for example, configured to limit movement of the second moving component 140a. For instance, when the position-limiting portions 141b are respectively abutted against the first guiding portions 161, the second moving component 140a stops moving. On the other hand, after a portion of each of the pads 160 is moved out of the corresponding opening hole 114, the corresponding position-limiting portion 161a and the corresponding second guiding portion 141a are separated from each other and are abutted against the first inner surface 111, so as to prevent each of the pads 160 from falling out of the corresponding opening hole 114.

In the state shown in FIG. 5B, a portion of each of the pads 160 protrudes from the operating surface 110a (i.e., the surface with the keyboard) of the first machine body 110. If the operating surface 110a (i.e., the surface with the keyboard) of the first machine body 110 is abutted against the table surface, the pads 160 may provide a supporting function, and that the operating surface 110a (i.e., the surface with the keyboard) is prevented from being in contact with the table surface directly to be abraded. Otherwise, when the electronic device 100A is dropped, the pads 160 may serve to mitigate the impact force. On the other hand, if the electronic device 100A is restored from the fully unfolded state illustrated in FIG. 5B (i.e., the tablet mode) to the folded state illustrated in FIG. 5A, the elastic restoring force of the elastic component 156a may drive the second moving component 140a to move along the direction opposite to the moving direction D, such that the second moving component 140a is returned to the initial position illustrated in FIG. 5A. Simultaneously, each of the first guiding portions 161 is no longer pushed by the corresponding second guiding portion 141a. As shown in FIG. 5A, each of the pads 160 thereby moves inside the corresponding opening hole 114 along the direction opposite to the moving direction D1, and moreover, the first guiding portion 161 of each of the pads 160 is driven to move back into the first machine body 110.

In view of the foregoing, in the electronic device provided by the embodiments of the invention, when the hinge structure is rotated, the towing structure may be driven, and that the moving component is driven by the towing structure to move relative to the first machine body. In an embodiment, after the moving component moves relative to the first machine body, the inner portion of the first machine body is communicated with the outside environment, such that heat generated when the electronic elements operate inside the first machine body may be exhausted to the outside. In contrast, if the moving component is driven to block the connection between the inner portion of the first machine body and the outside environment, external dusts or foreign substances are prevented from entering into the first machine body. In another embodiment, after the moving component moves relative to the first machine body, the pads are driven to protrude from the first machine body. If the first machine body is abutted against the table surface, the pads may provide the supporting function, and that the first machine body is prevented from being abraded. In still another embodiment, after the moving component moves relative to the first machine body, the moving component can be in contact with the heat dissipation component disposed in the inner portion of the first machine body. The moving component may be a hard disk drive (HDD) or other electronic element, as such, heat generated when the hard disk drive (HDD) operates or when other electronic elements operate may be dissipated through the heat dissipation component.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. An electronic device, comprising,
a first machine body;
a second machine body;

a hinge structure, configured to pivot the first machine body and the second machine body, wherein the first machine body is capable of rotating 360 degrees relative to the second machine body by the hinge structure;

a moving component, movably disposed in the first machine body; and a towing structure, disposed in the first machine body and coupled to the hinge structure and the moving component, the towing structure is configured to be driven by the hinge structure to drive the moving component to move relative to the first machine body, wherein the moving component is driven by the towing structure to move relative to the first machine body to expose or cover a plurality of first opening holes on a side of a first inner surface, wherein one side of the first machine body has a plurality of first opening holes, the moving component is disposed corresponding to the first opening holes, and the moving component is driven by the towing structure to move relative to the first machine body to expose or cover the first opening holes, wherein the moving component has a plurality of second opening holes configured to be respectively aligned to the first opening holes or misaligned to the first opening holes when the moving component is driven by the towing structure to move relative to the first machine body.

2. The electronic device as claimed in claim 1, wherein the hinge structure comprises a first hinge and a second hinge rotatably connected to each other, the first hinge is connected to the first machine body, and the second hinge is connected to the second machine body.

3. The electronic device as claimed in claim 2, wherein the towing structure comprises a towing rope, the towing rope has a first end portion and a second end portion opposite to each other, the first end portion is connected to the first hinge, the second end portion is connected to the moving component, and the towing rope is configured to move along with rotation of the first hinge and drive the moving component to move relative to the first machine body.

4. The electronic device as claimed in claim 3, wherein the towing structure further comprises a sleeve fixed into the first machine body, and the towing rope penetrates through the sleeve.

5. The electronic device as claimed in claim 3, wherein the towing structure further comprises an elastic component fixed into the first machine body and connected to the moving component, and the towing rope and the elastic component are respectively located at two opposite sides of the moving component.

6. The electronic device as claimed in claim 1, wherein one side of the first machine body has a plurality of opening holes, the moving components is disposed corresponding to the opening holes, the electronic device further comprises a plurality of pads movably disposed in the opening holes, and the pads are configured to be guided by the moving component to partially move out of the opening holes respectively when the moving component is driven by the towing structure to move relative to the first machine body.

7. An electronic device, comprising:
a first machine body;
a second machine body;
a hinge structure, configured to pivot the first machine body and the second machine body, wherein the first machine body is capable of rotating 360 degrees relative to the second machine body by the hinge structure;

a moving component, movably disposed in the first machine body, a towing structure, disposed in the first machine body and coupled to the hinge structure and the moving component, the towing structure is configured to be driven by the hinge structure to drive the moving component to move relative to the first machine body, and wherein a first guiding portion of each of a plurality of pads is located in the first machine body, the moving component has a plurality of second guiding portions disposed corresponding to the first guiding portions, and each of the second guiding portions is configured to push the corresponding first guiding portion when the moving component is driven by the towing structure to move relative to the first machine body such that each of the pads is partially pushed out of the corresponding opening hole.

8. An electronic device, comprising:
a first machine body;
a second machine body;
a hinge structure, configured to pivot the first machine body and the second machine body, wherein the first machine body is capable of rotating 360 degrees relative to the second machine body by the hinge structure;

a moving component, movably disposed in the first machine body; and a towing structure, disposed in the first machine body and coupled to the hinge structure and the moving component, the towing structure is configured to be driven by the hinge structure to drive the moving component to move relative to the first machine body, wherein the moving component is an electronic element, the electronic device further comprises a first buffer component and a second buffer component, and the first buffer component and the second buffer component are disposed in the first machine body and are respectively located at two opposite sides of the electronic element, wherein the first machine body has a first inner surface and a second inner surface opposite to each other, the first buffer component is abutted against the electronic element and the first inner surface, and the second buffer component is abutted against the electronic element and the second inner surface.

9. The electronic device as claimed in claim 8, further comprising a first heat dissipation component disposed at the first inner surface and a second heat dissipation component disposed at the second inner surface, the electronic element compressing the first buffer component and being in contact with the first heat dissipation component when the electronic element being driven by the towing structure to move towards the first inner surface, the electronic element compressing the second buffer component and being in contact with the second heat dissipation component when the electronic element being driven by the towing structure to move towards the second inner surface.

* * * * *